United States Patent
Rhodes et al.

(10) Patent No.: US 9,328,179 B2
(45) Date of Patent: May 3, 2016

(54) WATER SOLUBLE NORBORNENE-TYPE POLYMERS AND PHOTOIMAGEABLE COMPOSITIONS THEREOF

(71) Applicants: PROMERUS, LLC, Brecksville, OH (US); SUMITOMO BAKELITE CO., LTD., Shinagawa-Ku, Tokyo (JP)

(72) Inventors: Larry F. Rhodes, Brecksville, OH (US); Hugh Burgoon, Brecksville, OH (US); Steven J. Smith, Brecksville, OH (US); Kazuyoshi Fujita, Tokyo (JP)

(73) Assignees: PROMERUS, LLC, Brecksville, OH (US); SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 14/285,806

(22) Filed: May 23, 2014

(65) Prior Publication Data

US 2014/0349233 A1   Nov. 27, 2014

Related U.S. Application Data

(60) Provisional application No. 61/826,649, filed on May 23, 2013.

(51) Int. Cl.
| | | |
|---|---|---|
| G03F 7/004 | (2006.01) | |
| C08F 32/04 | (2006.01) | |
| C08F 232/08 | (2006.01) | |
| G03F 7/039 | (2006.01) | |
| G03C 1/73 | (2006.01) | |
| G03F 7/20 | (2006.01) | |
| C08F 132/04 | (2006.01) | |

(52) U.S. Cl.
CPC ............... *C08F 32/04* (2013.01); *C08F 132/04* (2013.01); *C08F 232/08* (2013.01); *G03C 1/73* (2013.01); *G03F 7/0045* (2013.01); *G03F 7/0395* (2013.01); *G03F 7/20* (2013.01)

(58) Field of Classification Search
CPC .... G03F 7/0395; G03F 7/0045; C08F 232/08
USPC ............... 430/270.1, 927, 913; 526/281, 308, 526/238.2
See application file for complete search history.

(56) References Cited

U.S. PATENT DOCUMENTS

| | | | | |
|---|---|---|---|---|
| 5,972,385 | A | * | 10/1999 | Liu et al. ........................ 424/486 |
| 2003/0118933 | A1 | * | 6/2003 | Han et al. .................... 430/270.1 |

(Continued)

FOREIGN PATENT DOCUMENTS

| | | |
|---|---|---|
| WO | WO96/20236 | 7/1996 |
| WO | WO98/21220 | 5/1998 |

OTHER PUBLICATIONS

Wathier et al., Acidic Polysaccharide Minics via Ring-Opening Methathesis Polymerization, Journal of the Americal Chemical Society, 132, pp. 15887-15889 92010).*

International Search Report and Written Opinion of the International Searching Authority mailed Aug. 21, 2014 for PCT/US2014/039288 filed May 23, 2014.

(Continued)

*Primary Examiner* — Amanda C Walke
(74) *Attorney, Agent, or Firm* — Balaram Gupta

(57) ABSTRACT

Embodiments in accordance with the present invention encompass water soluble polycyclic vinyl addition polymers having a norbornene type repeat unit derived from a norbornene type of monomer that encompasses a saccharide functional moiety. Embodiments in accordance with the present invention also encompass low and high molecular weight polymers with low catalyst loading.

18 Claims, 1 Drawing Sheet

(56) References Cited

U.S. PATENT DOCUMENTS

| | | | |
|---|---|---|---|
| 2005/0038436 A1* | 2/2005 | Michelson | 606/69 |
| 2005/0038455 A1* | 2/2005 | Bates et al. | 606/153 |
| 2005/0170279 A1* | 8/2005 | Hohle et al. | 430/270.1 |
| 2007/0026046 A1 | 2/2007 | Fogg et al. | |
| 2007/0173609 A1* | 7/2007 | Liaw et al. | 525/288 |
| 2009/0075207 A1* | 3/2009 | Lee et al. | 430/286.1 |
| 2010/0099906 A1* | 4/2010 | Bell et al. | 558/428 |
| 2011/0009578 A1* | 1/2011 | Rhodes et al. | 526/135 |
| 2011/0065878 A1* | 3/2011 | Rhodes et al. | 526/243 |

OTHER PUBLICATIONS

Cassandra Fraser, et al., Synthesis of Glycopolymers of Controlled Molecular Weight by Ring-Opening Metathesis Polymerization Using Well-Defined Functional Group Tolerant Ruthenium Carbene Catalysts, Macromolecules, vol. 28, No. 21, pp. 7248-7255, 1995.

Kotohiro Nomura, et al., Preparation of "Sugar-Coated" Homopolymers and Multiblock ROMP Copolymers, Macromolecules, vol. 29, No. 2, pp. 540-545, 1996.

\* cited by examiner

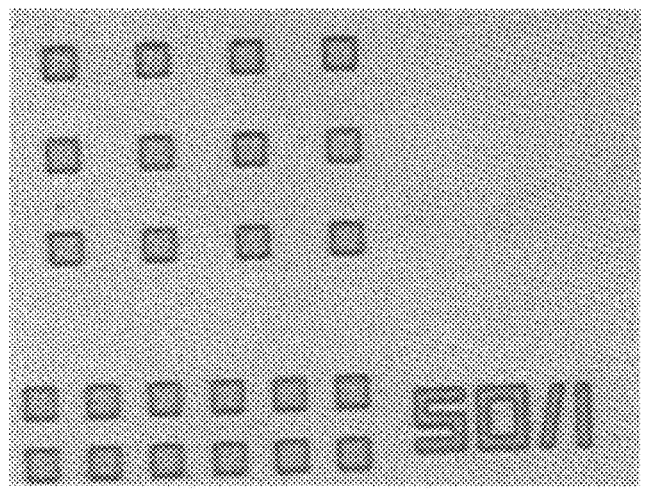

WATER SOLUBLE NORBORNENE-TYPE POLYMERS AND PHOTOIMAGEABLE COMPOSITIONS THEREOF

CROSS REFERENCE TO RELATED APPLICATIONS

This application claims the benefit of U.S. Provisional Application No. 61/826,649, filed May 23, 2013, which is incorporated herein by reference in its entirety.

TECHNICAL FIELD

Embodiments in accordance with the present invention relate generally to water soluble norbornene-type polymers and methods of forming such polymers, and more specifically to compositions of such polymers and uses of such compositions for forming photoimageable films.

BACKGROUND

Although there has been significant awareness to use "environmentally friendly" chemicals and processes, most of the photopolymers that are currently used in such technologies as semiconductor device fabrication, flat-panel device or antireflective coatings involve organic solvents and developed in solvents or aqueous solutions containing organic bases. Thus there is a growing need for aqueous based development technologies and water soluble materials that are "environmentally friendly."

One such example of a class of water soluble polymer is glycopolymer, which is also often referred to as "sugar polymer." Glycopolymers have been found useful for a variety of biotechnical applications. While initially, such glycopolymers were prepared by radical polymerization of olefin or acrylamide monomers having sugar residues as pendent groups, in 1995 Fraser et al. ("*Synthesis of Glycopolymers of Controlled Molecular Weight . . .*", Macromolecules, 1995, v. 28, p. 7248-7255) was among the first to report the Ring-Opening Metathesis Polymerization (ROMP) of glucose substituted norbornene monomers. Fraser et al. reported using Ruthenium carbene catalysts to initiate the polymerization. Following Fraser et al., Nomura et al., reported the use of Molybdenum catalyzed living ROMP techniques ("*Preparation of "Sugar-Coated" Homopolymers and Multiblock ROMP Copolymers*", 1996, v. 29, p. 540-545). While such norbornene-type ROMP polymers may be useful for biological and/or biotechnical applications, the presence of unsaturation in the polymer backbone is known to limit their applications in other applications, such as optoelectronic applications, among others. For instance, their lack of thermo-oxidative stability and resistance to reactive ion etching, makes them unsuitable for use in microelectronic and optoelectronic devices and fabrication thereof. Even more importantly due to the presence of unsaturated double bonds, ROMP polymers also exhibit high absorbance at low wavelengths thus rendering them unsuitable for optoelectronic applications.

In 1999, Havard et al. reported the development of sugar-containing polymethacrylates that were useful as photoresists ("Photoresists with Reduced Environmental Impact: Water-Soluble Resists Based on Photo-Cross-Linking of a Sugar-Containing Polymethacrylate", Macromolecules, 1999, v. 32, p. 86-94). While Puech et al. and Hu, et al (New J. Chem. 1997, 21, 1229 and Tet. Lett. 2002, 43, 1775, respectively), have had some success at forming norbornene-type vinyl addition polymers, such methods appear limited, in that the polymers obtained had low weight average molecular weights ($M_w$), (18,000 or less), or to a process having very high catalyst loading ratios (e.g. from 10:1 to 100:1).

Therefore it would be advantageous to provide water soluble norbornene-type vinyl addition polymers having at least one of (a) high molecular weights (including a process for making such polymers); (b) controllable molecular weights; and (c) a polymerization process for such polymers that does not require the high catalyst loading of the prior art.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

FIG. 1 shows photolithographic images of 50 µm features on a 50 µm pitch.

DETAILED DESCRIPTION

Exemplary embodiments in accordance with the present invention encompass water soluble norbornene-type polymers, photoimageable compositions thereof and methods for forming such polymers. Such exemplary embodiments will be described with reference to the Examples and Claims provided hereinafter. Various modifications, adaptations or variations of such exemplary embodiments may become apparent to those skilled in the art as such exemplary embodiments are disclosed. It will be understood that all such modifications, adaptations or variations that rely upon the teachings of the present disclosure, and through which these teachings have advanced the art, are considered to be within the scope of the present invention.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

As used herein, the terms "group" or "groups" when used in relation to a chemical compound and/or representative chemical structure/formula, mean an arrangement of one or more atoms.

As used herein, molecular weight values of polymers, such as weight average molecular weights ($M_w$) and number average molecular weights ($M_n$) are determined by gel permeation chromatography using polystyrene standards.

As used herein, polydispersity index (PDI) values represent a ratio of the weight average molecular weight ($M_w$) to the number average molecular weight ($M_n$) of the polymer (i.e., $M_w/M_n$).

It will be understood that in the context of this disclosure, the term "high Mw", e.g. for a water soluble norbornene-type polymer, should be taken to mean a polymer with a Mw of about 18,000 or higher.

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10.

As used herein the term "hydrocarbyl" and similar terms, such as "hydrocarbyl group" means a radical of a group that contains carbon and optionally hydrogen, non-limiting examples being alkyl, cycloalkyl, polycycloalkyl, aryl, aralkyl, alkaryl, alkenyl, cycloalkenyl, polycycloalkenyl, alkynyl, cycloalkynyl and polycycloalkynyl. The term "halohydrocarbyl" as used herein means a hydrocarbyl group where at least, one hydrogen covalently bonded to a carbon has been replaced by a halogen. The term "perhalocarbyl" as used herein means a hydrocarbyl group where all such hydrogens have been replaced by a halogen. In addition, the term "heterhydrocarbyl" as used herein means a hydrocarbyl group where at least one carbon atom has beers replaced with a hetero atom such as oxygen, nitrogen and/or sulfur.

As used herein, the term "alkyl" means a linear or branched acyclic or cyclic, saturated hydrocarbon group having a carbon chain length of from $C_1$ to $C_{25}$. Nonlimiting examples of suitable alkyl groups include methyl, ethyl, propyl, isopropyl, butyl, isobutyl, sec-butyl, tert-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, isocanyl, cyclopropyl, cyclobutyl, cyclopentyl, cyclohexyl, cycloheptyl and cyclooctyl. As used herein, the term "heterocycloalkyl" means a cycloalkyl group in which one or more carbons of the cyclic ring has been replaced with a hetero atom, such as oxygen, nitrogen and/or sulfur. Representative heterocycloalkyl groups include but are not limited to tetrahydrofuranyl, tetrahydropyranyl, morpholinyl, and piperidinyl.

As used herein, the term "aryl" means aromatic groups that include, without limitation, phenyl, biphenyl, benzyl, xylyl, naphthalenyl, anthracenyl. As used herein, the term "heteroaryl" means an aryl group in which one or more carbons of the aromatic ring or rings has been replaced with a hetero atom, such as oxygen, nitrogen and/or sulfur. Representative heteroaryl groups include but are not limited to furanyl, pyranyl and pyridinyl.

The terms "alkaryl" and "aralkyl" are used herein interchangeably and mean a linear or branched acyclic alkyl group substituted with at least one aryl group, for example, phenyl, and having an alkyl carbon chain length of $C_1$ to $C_{25}$. It will further be understood that the above acyclic alkyl group can be a haloalkyl or perhaloalkyl group.

As used herein, the term "alkenyl" means a linear or branched acyclic or cyclic hydrocarbon group having one or more double bonds and having an alkenyl carbon chain length of $C_2$ to $C_{25}$. Non-limiting examples of alkenyl groups include, among others, vinyl or ethenyl, allyl, propenyl, butenyl, pentenyl, hexenyl, heptenyl, octenyl, nonenyl, decenyl, undecenyl, dedecenyl, tridecenyl, tetradecenyl, pentadecenyl, hexadecenyl, heptadecenyl, octadecenyl, nonadecenyl, and isocenyl.

As used herein, the term "alkynyl" means a linear or branched acyclic or cyclic hydrocarbon group having one or more carbon-carbon triple bonds and having an alkynyl carbon chain length of $C_2$ to $C_{25}$. Representative alkynyl groups, include but are not limited to, ethynyl, 1-propynyl, 2-propynyl, 1-butynyl, 2-butynyl, pentynyl, heptynyl, octynyl, nonynyl, decynyl, undecynyl, dodecynyl, tridecynyl, tetradecynyl, pentadecynyl, hexadecynyl, heptadecynyl, octadecynyl, nonadecynyl, isocynyl.

As used herein, recitations of "linear or branched" groups, such as linear or branched alkyl, will be understood to include a methylene group, groups that are linear, such as linear $C_2$-$C_{25}$ alkyl groups, and groups that are appropriately branched, such as branched $C_3$-$C_{25}$ alkyl groups.

As used herein, the term "polymer" is meant to encompass polymers having only one type of repeating unit, i.e., homopolymers as well as polymers having more than one type of repeating units, i.e., copolymers, terpolymers, and so on.

As used herein, the term "polymer composition" is meant to include at least one synthesized polymer, as well as residues from initiators, solvents, or other elements attendant to the synthesis of such polymers, where such residues are understood, as not being covalently incorporated thereto. Such residues and other elements considered as part of the polymer composition are typically mixed or comingled with the polymer such that they tend to remain therewith when it is transferred between vessels or between solvent or dispersion media. A polymer composition can also include materials added after synthesis of the polymer to provided or modify specific polymers of such composition.

The terms "norbornene-type", "poly(norbornene)", "polycycloolefin" and "poly(cyclic) olefin" are used interchangeable herein.

The term "norbornene-type" is used herein to mean a monomer in accordance with Structure 1 shown below, or a polymeric material formed from at least one such norbornene-type monomer and therefore has at least one repeat unit in accordance with Structure 2, also shown below:

It will be understood that where various compounds are described as monomers and/or polymerizable monomers, that such compounds are structurally analogous to Structure 1, above. That is to say, such compounds have a polymerizable double bond as shown in 1 above. It will also be understood, that when such monomers are polymerized, they are incorporated into a polymer structure as "repeat units" or "repeating units" that are structurally analogous to Structure 2, above. That is to say that, the polymerization occurs across the double bond of Structure 1 as shown in Structure 2 and the resulting polymer is generally referred to as a vinyl addition polymer.

Further, the term norbornene-type monomer is used herein to mean, in addition to norbornene itself, any substituted norbornene(s), or substituted and unsubstituted higher cyclic derivatives thereof. Thus, in one of the embodiments there is provided a water soluble norbornene-type polymer comprising a first type of norbornene-type repeating unit represented by Formula B1, which is derived from norbornene-type monomer represented by Formula A1:

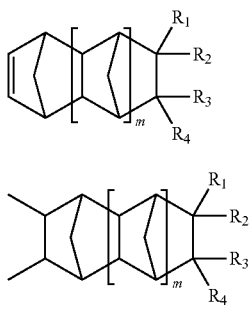

A1

B1

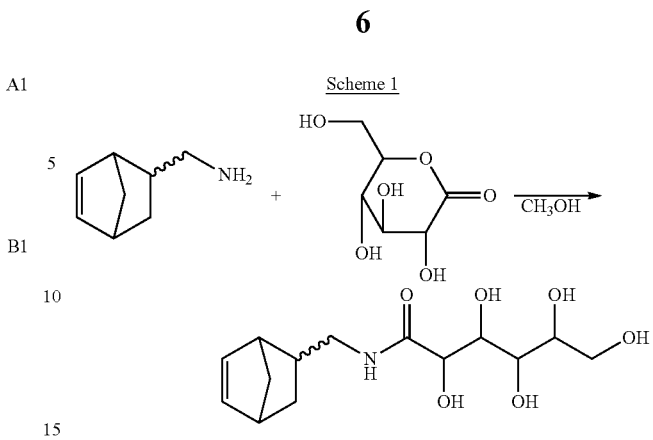

Scheme 1

Where m is 0 or 1, at least one of $R_1$, $R_2$, $R_3$, and $R_4$ is a saccharide functional moiety selected from monosaccharide, disaccharide, trisaccharide, oligosaccharide or a polysaccharide, and the remaining $R_1$, $R_2$, $R_3$, and $R_4$ are hydrogen.

The polymer in accordance with this invention generally exhibits a weight average molecular weight ($M_w$) of at least 18,000. In addition, it has also been observed that the polymers made in accordance with this invention, generally exhibits a low polydispersity index (PDI) values, i.e., no more than 1.7. Generally, as further described in detail below the molecular weight of the polymer of this invention can be controlled by employing suitable amounts of catalyst, co-catalyst and the chain transfer activating agent.

It should be noted that in deriving a repeating unit represented by Formula B1 from a monomer represented by Formula A1, the substitution and nature of any of the substituents is unmodified; thus it can be said that repeating units of polymer embodiments of the present invention are unmodified repeating units.

As used herein, the terms "saccharide-type" monomer and "saccharide norbornene-type" monomer will be used interchangeably and will be understood to refer to a norbornene-type monomer(s) or repeating unit(s) where at least one of $R_1$—$R_4$ is a saccharide functional moiety (SFM) derived from a saccharide precursor such as is represented by Formula A3, shown below:

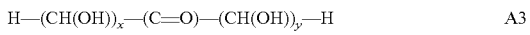

A3 where when one of x and y is equal to 0, A3 is referred to as an aldose, and when both x and y are greater than zero, A3 is referred to as a ketose. In either case, the sum of x and y is from 2 to 6.

It will be understood that the SFMs derived from a compound in accordance with Formula A3 is a broad representation of possible saccharides. Further, it will be understood that the exemplary saccharides provided hereinafter, are non-limiting as they are illustrative only being presented for ease of understanding and explanation. Such saccharide molecules become pendant groups of norbornene-type monomers through one or more reactive methods. For example, one such reactive method involves a reaction between the gluconolactone and a suitable norbornene-type monomer, such as norbornene-5-methylamine, in a protic solvent, such as methanol to yield a norbornene gluconamide monomer as illustrated in Scheme I (See Puech, et al., *New J. Chem.*, 1997, 21, 1230).

While the method illustrated in Scheme I is representative of one reactive method, other methods will be obvious to one skilled in the art from the norbornene-type monomers encompassing saccharide functional moieties of Formulae A4, A5, A6, A7, A8, A9, A10, A11, A12, A13, and A14 as shown below.

As used herein, the term "monosaccharide" will be understood to mean all known basic single units of carbohydrates, including the basic structural unit, A3, as shown above which include all known aldoses and ketoses. Representative examples of monosaccharides include but not limited to glucose (dextrose), fructose (levulose), galactose, xylose and ribose. Additionally, the monosaccharide represented by structural formula, A3, is classified differently based upon the number of carbons atoms it contains: diose (2), triose (3), tetrose (4), pentose (5), hexose (6), heptose (7), and so on, all of which are inclusive of a monosaccharide of this invention.

As used herein, the term "disaccharide" or "biose" will be understood to refer to two monosaccharide units bound together by a covalent bond known as a glycosidic linkage. Generally, such glycosidic linkage is formed by a condensation reaction between two monosaccharides resulting in the elimination of water. Exemplary disaccharides that are suitable in the formation of disaccharides of this invention include but not limited to sucrose (a disaccharide of glucose and fructose), lactose (a disaccharide of glucose and galactose), maltose (a disaccharide of two glucose molecules with an α1-4 glycosidic bond), lactulose (a disaccharide of fructose and galactose), trehalose (a disaccharide of two glucose molecules with an α1-α1 glycosidic bond) and cellobiose (a disaccharide of two glucose molecules with an β1-4 glycosidic bond).

As used herein, the term "trisaccharides" will be understood to refer to oligosaccharides composed of three monosaccharides with two glycosidic bonds connecting them. Similar to the disaccharides, each glycosidic bond can be formed between any hydroxyl group on the component monosaccharides, thus resulting in diastereoisomeric forms having different chemical and physical properties. All of such forms can be utilized in the formation of saccharides of this invention. Accordingly, exemplary trisaccharides that can be utilized in this invention include without any limitation isomaltotriose, maltotriose, nigerotriose, melezitose, and the like.

As used herein, the term "oligosaccharide" will be understood to refer to between four and ten monosaccharide units similarly bound by a covalent bond. Finally, as used herein, the term "polysaccharide" will be understood to refer to more than ten monosaccharide units similarly bound by a covalent bond.

Some embodiments in accordance with the present invention encompass polymerization methods for providing water soluble vinyl-addition polymers having desirable molecular weights with low catalyst loading. Such vinyl-addition polymers generally having superior thermo-oxidative stability than analogous ROMP polymers. Furthermore, such embodiments do not increase the complexity of the polymerization process or the cost of the resulting polymer compared to the previously known ROMP polymerization techniques.

Accordingly, there is provided a method for making a water soluble norbornene-type polymer comprising the following procedures. However, it should be noted that the order of these procedures are not important and one of skill in the art of polymer chemistry readily appreciates that the reaction vessel can first be charged with solvent and the catalyst system or the reactive monomers and the other ingredients can be introduced into the reaction vessel. Alternatively, the solvent, catalyst and the monomers can be simultaneously metered into the vessel or some other way they can be introduced to affect the polymerization reaction. In most situations the polymerization reactions are carried out under anaerobic conditions by sparging the contents of the reaction vessel with nitrogen prior to polymerization. Any other inert gases can also be used for this purpose including helium or argon.

Accordingly, the reaction vessel is charged with a first type of norbornene-type monomer represented by Formula A1:

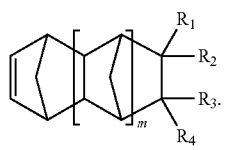

A1

Where m, $R_1$, $R_2$, $R_3$, and $R_4$ are as defined herein. Then, as noted, the reaction vessel is sparged with nitrogen and then charged with an appropriate solvent, a catalyst, a suitable chain transfer activating agent, and an optional co-catalyst where the monomer to catalyst ratio is at least 500/1.

After all of the reactants are introduced into the reaction vessel, the vessel is provided with a suitable agitation means to promote dissolution of the first type of norbornene-type monomer, catalyst, chain transfer activating agent and optional co-catalyst in the solvent. For example, such agitation can be affected by any of the known stirring mechanisms by employing a suitable stirring blades equipped with a mechanical stirring device or a magnetic stirrer which can bring about the similar effect or any other such mechanical, electrical or magnetic devices can be employed.

Then the reaction vessel is equipped with a suitable heater to provide heat and the agitation of the contents of the reaction vessel is continued for a time sufficient to facilitate polymerization of the first type of norbornene-type monomer to obtain a polymer having a controlled weight average molecular weight ($M_w$) of from about 18,000 to about 200,000.

Accordingly, as noted above, the polymer embodiments of the present invention, encompass norbornene-type, vinyl-addition polymers that are derived from at least one of a first type of monomer that is in accordance with Formula A1 where at least one of $R_1$—$R_4$ is a saccharide functional moiety. Such first type of monomer being selected to provide, when polymerized in accordance with polymerization method embodiments of the present invention, high $M_w$ water soluble norbornene-type polymers.

Other polymer embodiments can encompass norbornene-type, vinyl-addition polymers that are derived from at least yet another distinct second type of monomer that is in accordance with Formula A2, which is distinct, from the first type of norbornene-type monomer as described above:

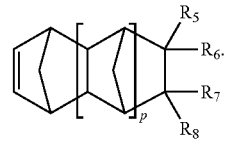

A2

Where p is 0 or 1, at least one of $R_5$, $R_6$, $R_7$, and $R_8$ is a hydrocarbyl group, and the remaining $R_5$, $R_6$, $R_7$, and $R_8$ are hydrogen. Such first and second distinct types of monomers being selected to provide, when polymerized in accordance with polymerization method embodiments of the present invention, high $M_w$ water soluble norbornene-type polymers.

Accordingly, there is further provided a polymer comprising the second type of norbornene-type repeating unit represented by Formula B2 derived from a second norbornene-type monomer represented by Formula A2:

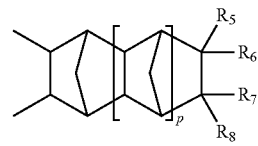

B2

Where p, $R_5$, $R_6$, $R_7$, and $R_8$ are as defined above.

Various norbornene-type monomers having various hydrocarbyl groups, including halohydrocarbyl or heterohydrocarbyl groups as described herein can be employed as the second type of norbornene monomer. It should further be noted that the amount of second type of norbornene type of monomer used is sufficient enough to result in a polymer still exhibiting water solubility. Thus for example certain of the second type of norbornene type of monomers of Formula A2 described herein can be employed in more than equimolar ratio with the saccharide containing first type of norbornene type of monomer of Formula A1, whereas certain other second type of norbornene type monomer of Formula A2 can only be used in small quantities in order to obtain a polymer which is still water soluble. Thus one of skill in the art readily appreciates desirable quantities of monomers of Formulae A1 or A2 that can be used to form the polymers of this invention.

Representative examples of such monomers include without any limitation the following:

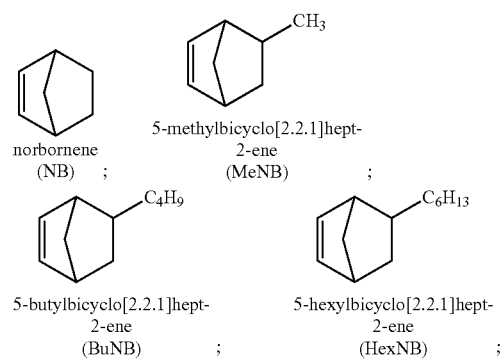

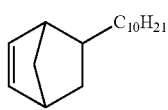
5-octylbicyclo[2.2.1]hept-
2-ene
(OctNB)

5-decylbicyclo[2.2.1]hept-
2-ene
(DecNB)

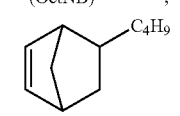
5-perfluorobutylbicyclo[2.2.1]hept-
2-ene
(NBC₄F₉)

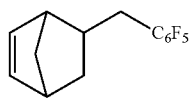
5-pentafluorobenzylbicyclo[2.2.1]hept-
2-ene
(PFBNB)

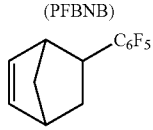
5-pentafluorophenylbicyclo[2.2.1]hept-
2-ene
(PFPNB)

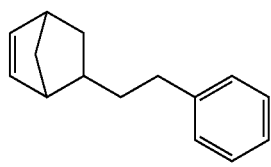
5-phenethylbicyclo[2.2.1]hept-2-ene
(PENB)

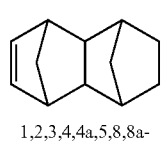
1,2,3,4,4a,5,8,8a-
octahydro-1,4:5,8-
dimethanonaphthalene
(TD)

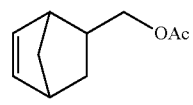
bicyclo[2.2.1]hept-5-en-
2-ylmethyl acetate
(MeOAcNB)

2-bicyclo[2.2.1]hept-5-
en-2-yl)propan-2-ol
(NBXOH)

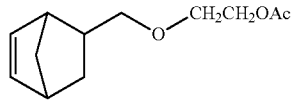
2-(bicyclo[2.2.1]hept-5-en-2-
ylmethoxy)ethyl acetate
(NBCH₂GlyOAc)

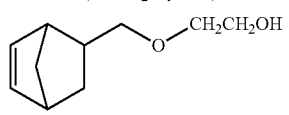
2-(bicyclo[2.2.1]hept-5-en-2-
ylmethoxy)ethanol
((NBCH₂GlyOH)

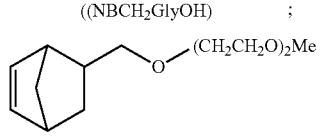
5-((2-(2-methoxyethoxy)ethoxy)methyl)
bicyclo[2.2.1]hept-2-ene
(NBTON)

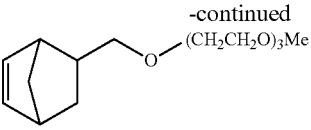
1-(bicyclo[2.2.1]hept-5-en-2-yl)-2,5,8,11-
tetraoxadodecane
(NBTODD)

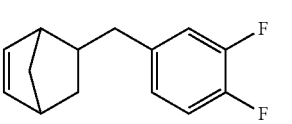
5-(3,4-difluorobenzyl)bicyclo[2.2.1]hept-
2-ene
(NBCH₂C₆H₃F₂)

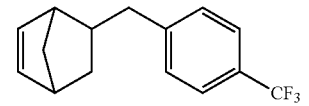
5-(4-trifluoromethyl)benzyl)bicyclo[2.2.1]hept-
2-ene
(NBCH₂C₆H₄CF₃)

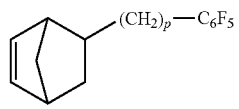
5-((perfluorophenyl)alkyl)bicyclo[2.2.1]hept-
2-ene (NBalkylC₆F₅), where p = 1 (methyl),
2 (ethyl), 3 (propyl), 4 (butyl), 5 (pentyl)
or 6
(hexyl)

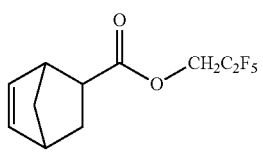
2,2,3,3,3-pentafluoropropyl
bicyclo[2.2.1]hept-5-ene-2-
carboxylate
(PFPrCNB)

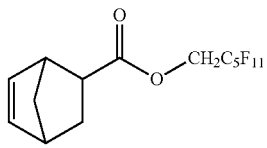
perfluoropentylmethyl
bicyclo[2.2.1]hept-5-ene-2-
carboxylate
(PFPMeCNB)

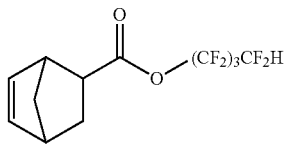
1,1,2,2,3,3,4,4-octafluorobutyl
bicyclo[2.2.1]hept-5-ene-2-carboxylate
(FOCHNB)

bicyclo[2.2.1]hept-5-en-2-ylmethyl
perfluorooctanoate
(C8PFAcNB)  ;

5-((1,1,2-trifluoro-2-
(perfluoropropoxy)ethoxy)methyl)bicyclo[2.2.1]hept-
2-ene
(PPVENB)  ;

dicyclopentadiene
(DCPD)  ;

2-(6-(bicyclo[2.2.1]hept-
5-en-2-yl)hexyl)oxirane
(HxONB)  ;

2-((bicyclo[2.2.1]hept-5-en-2-
ylmethoxy)methyl)oxirane
(MGENB)  .

With regard to the polymer composition embodiments in accordance with the present invention, it will be noted that such embodiments are not limited to a single polymer embodiment. Rather such polymer composition embodiments are inclusive of blends of two or more polymers, where each of such two or more polymers encompass one or more distinct type of norbornene-type repeating unit with the proviso that at least one such repeating unit of each polymer encompass a saccharide functional moiety (SFM).

In some polymer or polymer composition embodiments, said SFM is derived from molecules represented by Formula A3 and encompasses a monosaccharide selected from a derivative of an aldose, a ketose, L isomers thereof, D isomers thereof, cyclic isomers thereof. In other such embodiments, said saccharide functional moiety can encompass a disaccharide, an oligosaccharide, a polysaccharide or cyclic isomers derived therefrom.

Exemplary aldoses include, but are not limited to, D-aldoses such as erythrose, threose, ribose, arabinose, xylose, lyxose, allose, altrose, glucose, mannose, gulose, idose, galactose and talose, the structures of which are depicted below:

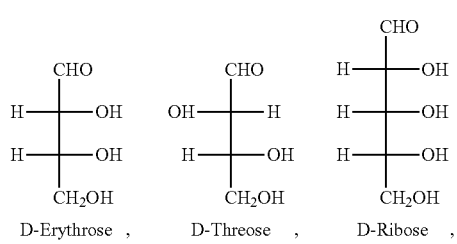

Exemplary ketoses include, but are not limited to, D-ketoses such as erythrulose, xylulose, ribulose, tagatose, sorbose, and fructose, the structures of which are depicted below:

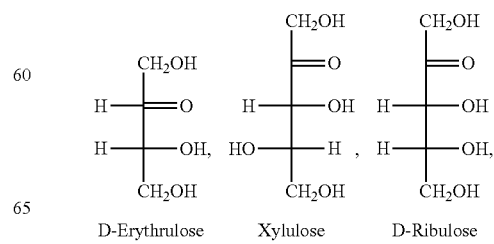

-continued

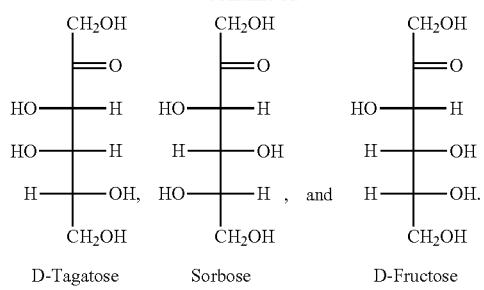

D-Tagatose    Sorbose    D-Fructose

Such aforementioned non-limiting examples of saccharide-type repeating units are in accordance with Formula B1, where at least one of $R_1$—$R_4$ is an alkyl, aryl, amide, ether or ester linked SFM as illustrated in Formulae A4-A14, below.

(A4)

(A5)

(A6)

(A7)

(A8)

(A9)

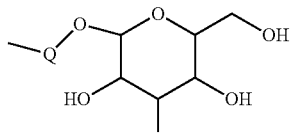 (A10)

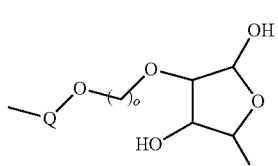 (A11)

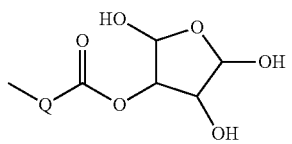 (A12)

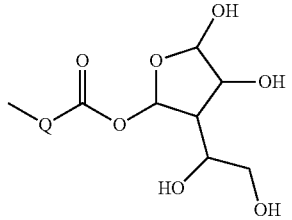 (A13)

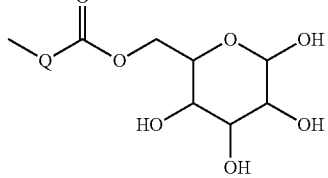 (A14)

where Q, if present, encompasses an optional $C_1$ to $C_6$ alkyl group and o is greater than 1.

In some embodiments, it has been found advantageous for such SFM to have at least one of $R_1$ to $R_4$ be either an amide linked gluconolactone as represented by Formula A6 or an amide linked glucorono-6,3-lactone as represented by Formula A8, in each case, the others being hydrogen.

As mentioned above, some embodiments encompass both a norbornene type of repeating unit, B1, having a SFM and a norbornene-type of repeating unit, B2, having a hydrocarbyl substituent, such as a heterohydrocarbyl substituent that is not a saccharide moiety. Some such norbornene-type repeating units having at least one of $R_1$ to $R_4$ being heterohydrocarbyl represented by one of Formulae A15, A16 and A17, and the others being hydrogen:

A15

A16

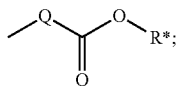

where Q, if present, is as described above and R* is hydrogen or $C_1$-$C_6$ cyclic, linear or branched aliphatic group. Additional exemplary norbornene-type monomers having a non-saccharide heterohydrocarbyl or halohydrocarbyl type of substituent include those where at least one of $R_5$ to $R_8$ is $CH_2OCH_2CH_2OH$, $CH_2OCH_2CH_2OAc$, 1,1,1-trifluoromethane sulfonamide, ethoxy-1,1,1,3,3,3-hexafluoropropan-2-ol, trioxanonane, and tetraoxadodecane. Specific non-limiting examples of such monomers are enumerated above.

For some embodiments in accordance with the present invention, the polymers are formed using known or modified solution and/or mass polymerization methods. In other embodiments in accordance with the present invention, the polymers can be formed using known or modified suspension or emulsion polymerization methods. Generally, the polymerization is carried out in the presence of an appropriate solvent. Non-limiting examples of solvents include water and any other suitable water miscible solvent. As noted, water immiscible solvents can also be employed in a suspension or emulsion type polymerization conditions. In some embodiments water alone is used as the solvent.

For some embodiments in accordance with the present invention, a palladium catalyst complex and a chain transfer activating agent (CTAA) are added to norbornene-type monomers to cause such monomers to be polymerized.

In some polymer or composition embodiments, the polymer has a weight average molecular weight ($M_w$) from 18,00 to 200,000 Daltons, while in others, from 20,000 to 100,000 Daltons, and in still others, from 30,000 to 75,000 Daltons. The weight average molecular weight ($M_w$) and the number average molecular weight ($M_n$) are generally determined by gel permeation chromatography (GFC) using polystyrene standards. However, any of the other known methods can also be used to determine $M_w$ and $M_n$. From this the polydispersity index (PDI) of the polymer is determined ($M_w/M_n$). In some embodiments of this invention the polydispersity index of the polymers of this invention generally is from about 1 to 2, in some other embodiments of this invention the polydispersity index of the polymers of this invention generally is from about 1 to 1.7, and yet in some other embodiments of this invention the polydispersity index of the polymers of this invention generally is from about 1 to 1.5.

To facilitate formation of water soluble polymers from any of the aforementioned monomers, for example a first type of monomer encompassing a SFM and a second type of norbornene-type monomer encompassing a non-SFM hydrocarbyl group a polymerization reaction is carried out using a catalyst derived from palladium. Non-limiting examples of such palladium catalysts include the following:
allyl palladium chloride dimer,
(acetonitrile)bis(triisopropylphosphine)palladium(acetate) tetrakis(pentafluorophenyl)borate ([Pd(OAc)(P-i-$Pr_3$)$_2$(MeCN)][B($C_6F_5$)$_4$]),
nonasodium hydrido tris (tri(metasulfonatophenyl)phosphine)palladium methanesulfonate, and
(acetonitrile)bis(t-butyldicyclohexylphosphine)palladium (acetate) tetrakis(perfluorophenyl)borate.

It should however be noted that various other metal catalysts can also be used to carry out the polymerization reaction, including but not limited to nickel and platinum, among various other known metal catalysts.

It has further been found that the polymerization of the monomers of this invention can further be carried out in the presence of a variety of co-catalysts in order to obtain the desirable properties of the polymers. Non-limiting examples of such co-catalysts include one or more of the following:
Li tetrakis(pentafluorophenyl)borate etherate (LiFABA),
N-dimethylanilinium tetrakis-(pentafluorophenyl)borate (DANFABA), and
trisodium salt of triphenylphosphine m-trisulfonic acid (TPPTSNa).

Any amount of catalyst and co-catalysts can be used that will be sufficient to form the polymer of this invention. As noted, typically, the amount of catalyst employed is generally calculated based on the monomer to catalyst molar ratio of at least 500/1. In some other embodiments the monomer to catalyst ratio is around 1000/1, in some other embodiments the monomer to catalyst ratio is around 5000/1 and in some other embodiments the monomer to catalyst ratio is around 10000/1.

To adjust the solubility of such first type of monomer in the solvent used for such polymerization reaction, the alcohol functionalities of the SFMs can, optionally, be protected during the polymerization and subsequently de-protected after the polymerization reaction, is completed. As one of skill in the art will realize, protecting the alcohol functionalities of the SFMs increases the solubility of the monomer in organic solvents that are compatible with the second type of norbornene-type monomer. Subsequent de-protection of the alcohol functionalities provides a polymer embodiment that is likely to be water soluble. Such protecting groups include, but are not limited to, esters such as acetates, benzoates, chloroacetates, ethers such as benzyl ethers, alkyl ethers, allyl ethers, silyl ethers and acetals such as benzylidene and isopropylidene acetals.

Such aforementioned hydrocarbyl, including halohydrocarbyl and heterohydrocarbyl-type monomers provide repeating units, in accordance with Formula B2, that can provide, when polymerized with SFM-type monomers, high, readily controllable $M_w$, water soluble polymer embodiments in accordance with the present invention. Advantageously, the polymerization methods that are disclosed herein, are readily done using reasonable catalyst loading and reasonable control of the aforementioned high molecular weight as described above.

Surprisingly, it has further been found that use of chain transfer activating agent facilitates further control of the molecular weight of the resulting polymer. Thus, advantageously, in some of the embodiments of this invention employing a suitable amount of a chain transfer activating agent results in tailoring the resulting polymer to a desirable molecular weight. An example of such a chain transfer activating agent is formic acid.

Any amount of formic acid can be used that would result in a desirable control on the molecular weight of the resulting polymer of this invention. Generally, formic acid is present in an amount of from 0.1 to 30 mol % of the total monomer loading to the reaction mixture. In some embodiments formic acid is present in an amount of from 0.5 to 20 mol % of the total monomer loading to the reaction mixture. In some other embodiments formic acid is present in an amount of from 1 to 10 mol % of the total monomer loading to the reaction mixture.

Thus in accordance with the practice of this invention, non-limiting exemplary polymers of this invention include the following:

poly(N-norbornene methyl gluconamide),
poly(N-norbornene methyl lactobionamide), and
poly(norbornene-4-O-(β-D-galactopyranosyl)-β-1'-((+/−)-exo-5-norbornene-2-carboxyamido)-1'-deoxy glucitol.

In some embodiments, poly(N-norbornene methyl gluconamide) made in accordance with this invention is having a weight average molecular weight ($M_w$) from 18,000 to 130,000.

The polymer embodiments of the present invention can be employed to form polymer composition embodiments that further encompass a casting solvent and, optionally, one or more additives that provide desirable characteristics to such polymer composition embodiments. For example, additives such as cross-linking compounds, photoactive compounds (PACs), photoacid generators (PAGs), thermal acid generators (TAGs), photosensitizers, and antioxidants/synergists. Where PAGs or PACs are added to a polymer composition embodiment, such embodiments are generally self-imageable. That is to say that such a polymer composition embodiment, when imagewise exposed to appropriate actinic radiation will, after image development, provide either a positive or negative tone image of the masking element employed.

Generally, it has now been found that any of the PACs containing a diazo or diazido functional group can be used in this invention. However, various other similarly known and similarly functioning PACs can also be used in this invention. Accordingly, exemplary aqueous PACs include, but are not limited to, 4,4'-diazido-2,2'-biphenyl disodium disulfonate (DAPB), 4,4'-diazide-2,2'-biphenylethane disodium disulfonate (DABPE), and 4,4'-diazidostilbene-2,2'-disulfonic acid acid disodium salt (DAZST-Na). While the exemplary aqueous PACs provided hereinabove are sodium salts, one of ordinary skill will know that other alkaline or alkaline earth metals such as lithium, potassium, magnesium, calcium, barium, as well as ammonium and various alkylammonium salts are also in accordance with embodiments of the present invention.

Exemplary PAGs can include, but are not limited to, onium salts such as (p-isopropylphenyl)(p-methylphenyl)-iodonium tetrakis (pentrafluorophenyl) borate (Rhodorsil 2074, Rhodia, Inc.), sulfonium [2-(4-methoxy-1-naphthalenyl)-2-oxoethyl]dimethyl tetrakis (pentafluorophenyl)borate (TAG382 Toyo Ink), (4-methoxyphenyl)phenyliodonium trifluoromethanesulfonate, bis(p-tert-butylphenyl)-iodonium trifluoromethanesulfonate, triphenylsulfonium trifluoromethanesulfonate, (4-methoxyphenyl) diphenylsulfonium trifluoromethanesulfonate, (p-tert-butylphenyl) diphenylsulfonium trifluoromethanesulfonate, diphenyliodonium nonafluorobutanesulfonate, bis(p-tert-butylphenyl) iodonium nonafluorobutanesulfonate, triphenylsulfonium nonafluorobutanesulfonate and diphenyliodonium trifluoromethanephosphate. Additional examples of aqueous FAQs include, but are not limited to, 4-(methoxyphenyl)dimethylsulfonium trifluoromethanesulfonate (See Havard, et al., *Macromolecules*, 1999, 32, 86-94).

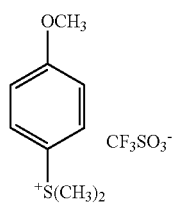

PAGs generally absorb actinic radiation over a broad range of wavelengths, while in modern photoexposure tools, a limited range of wavelengths or even a single wavelength, is provided. Therefore, in addition to at least one PAG, at least one photosensitizer can be included in the polymer compositions of the present invention, where at least one photosensitizer is selected to absorb at a wavelength(s) used for the image-wise exposure. Exemplary photosensitizer(s) are shown below:

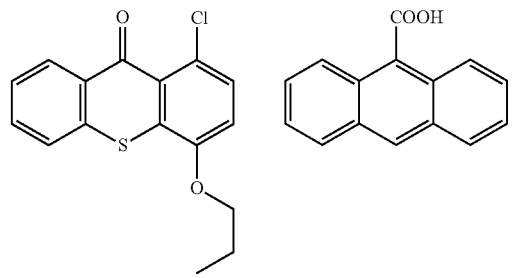

CPTX, photosensitizer
1-chloro-4-propoxy-9-H-thioxanthen-9-one
CAS 142770-42-1 , anthracene-9-carboxylic acid (CAS 723-62-6) and a suitable salt thereof including but not limited to lithium, sodium, potassium, calcium, ammonium and tetraalkylammonium salt, for example, tetramethylammonium or tetraethylammonium salts.

Exemplary TAGs include, among others, SI-60L, SI-100L and SI-150L, manufactured by Sanshin Chemical industry Co., Ltd., where SI-150L is dimethyl(4-acetoxyphenyl)sulfonium hexafluoroantimonate (CAS No. 135691-31-5), SI-100L is benzyl(4-hydroxyphenyl)methylsulfonium hexafluoroantimonate (CAS No. 125662-42-2) and SI-60L is (1-naphthylmethyl)methyl(4-hydroxyphenyl)sulfonium hexafluoroantimonate (CAS No. 133152-67-7).

In some polymer composition embodiments, crosslinking additives, such as epoxies, glycolurils, oxetanes and di- and multifunctional-aldehydes, for example glutaraldehyde, can be present. More specifically, exemplary crosslinking additives include, but are not limited to, poly(ethylene glycol) diglycidyl ethers (available from Sigma Aldrich), tetrakis (methoxymethyl) glycoluril (Powderlink 1174), and 3-methyacryloxymethyl-3-ethyloxetane (OXMA), (4,4'-bis[3-ethyl-3-oxetanyl)methoxymethyl]biphenyl) (OXBP), and bis [(3-ethyl-3-oxetanyl)methyl]isophthalate) (OXIPA) (all from UBE Industries, Ltd., Japan), a methylated melamine formaldehyde polymer under trade name Cymel 301 (Cytec Industries Inc., Woodland Park, N.J., USA). In addition, generic structures for bisphenol A epoxy resin (LX-01) purchased from Daiso Chemical Co., Osaka, Japan), epoxy cyclohexylmethyl 3,4-epoxycyclo hexane carboxylate (CEL2021 [CAS #2386-87-01]) purchased from Daicel Chemical Industries, Osaka, Japan) and condensation products of 1-2-epoxy-4(2-oxiranyl)-cyclohexane of 2,2-bis(hydroxy methyl)1-butanol/ (3'-4'expoxycyclohexane)methyl 3'-4'-expoxycyclohexyl-carboxylate mixture (EHPE3150 [CAS #244772-00-7]) purchased from Daicel Chemical Industries, Osaka, Japan) are shown below:

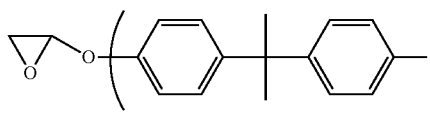
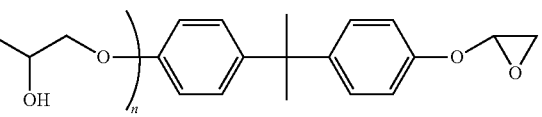

LX-01

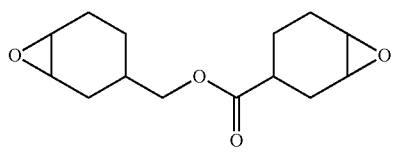

CEL 2021 and

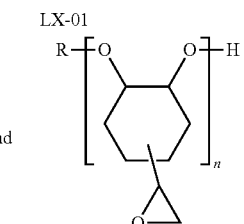

EHPE 3150

While the exemplary cross-linking materials listed above are generally not, in and of themselves, photoactive, when such materials are present in polymer composition embodiments of the present invention, cross-linking is generally initiated by an acid generator additive.

With regard to casting solvents, exemplary materials include, but are not limited to water, or a mixture of water and any one or more of propylene glycol monomethyl ether (PGME), propylene glycol monomethyl ether acetate (PGMEA), ethyl lactate (EL), methyl isobutyl carbinol (MIBC), gamma butyrolactone (GBL), methyl n-amyl ketone (MAK) or mixtures thereof.

It will be understood, however, that specific materials that fall within these listings of generally useful additives may or may not be useful for polymer composition embodiments in accordance with the present invention where a material's solubility in one of the aforementioned casting solvents is insufficient for any such material to be effective for its desired purpose. However, it is believed that an ordinarily skilled artisan, would be able to determine, without undue experimentation, whether or not a specific additive would be sufficiently soluble in such a casting solvent to realize the desired effect.

Accordingly, in some embodiments of this invention there is provided a method of forming a crosslinking composition comprising combining any one or more of the water soluble norbornene-type polymers as described herein with a suitable casting solvent and a crosslinking agent. Any of the casting solvents as described hereinabove can be used such as for example water and in combination with any of the water miscible solvents. In some embodiments the crosslinking agent used is glutaraldehyde. Typically, such crosslinking of such compositions can be affected at any of the temperatures which will bring about such a change, for example, temperatures below 200° C.

Thus in some embodiments, the polymer compositions of the present invention encompass an aqueous based crosslinkable composition containing any one or more of the water soluble norbornene-type polymers as described herein with a suitable casting solvent and a crosslinking agent.

In some embodiments, the polymer compositions of the present invention encompass at least one thermal acid generator (TAG) and at least one crosslinking additive to provide thermally-initiated crosslinking after image development.

In some embodiments, there is provided a method of forming a patterned image which encompasses the following steps, not necessarily in the same order. Forming a layer of aforementioned aqueous based crosslinking composition. Imagewise exposing the layer to appropriate actinic radiation using any of the methods known in the art. Then causing exposed portions of the layer to undergo crosslinking by any of the methods known to one skilled in the art. Finally, removing the unexposed portions of the layer to form the patterned image.

Accordingly, in some embodiments there is further provided aqueous based photoimageable compositions, which encompass any one or more of the water soluble norbornene-type polymers as described herein, one or more of various photoactive compounds as described herein and a suitable solvent.

With regard to methods that utilize polymer compositions embodiments in accordance with the present invention, such method embodiments generally encompass applying or casting such a composition over a substrate and forming a film or layer thereof. Such casting encompasses any appropriate method for applying a polymer composition onto a substrate, for example by a spin coating, a spray coating or a doctor blade method, among others. Further, with regard to film forming embodiments in accordance with the present invention, such embodiments encompass a post application bake (PAB) at a temperature and for a time sufficient to remove essentially all of the casting solvent.

Where the aforementioned polymer composition embodiments encompass a PAG, following the PAB, the formed film will generally be exposed to an effective wavelength of actinic radiation. Such exposure being either an image-wise exposure where a patterned film is desired or a blanket exposure where a contiguous film is desired, it will further be understood that the aforementioned exposure results in the generation of a strong acid in the exposed portions of the formed film, such strong acid either enhancing the solubility of such regions or where a cross-linking additive is present, causing cross-linking to occur within such exposed regions to reduce the solubility of such regions. However, it should also be noted that depending upon the type of saccharide moiety employed which itself may facilitate cross linking upon exposure without any additional cross-linking additive.

Where the aforementioned polymer composition embodiments encompass diazide PACs (such as 4,4'-diazidostilbene-2,2'-disulfonic acid disodium salt (DAZST-Na)), following the PAB, the formed film will generally be exposed to an effective wavelength of actinic radiation. Such exposure being either an image-wise exposure where a patterned film is desired or a blanket exposure were a contiguous film is desired. It will further be understood that the aforementioned exposure results in the generation of a reactive moiety in the exposed portions of the formed film, such reactive moiety reacts with the polymer causing cross-linking to occur within such exposed regions to reduce the solubility of such regions.

Where the aforementioned polymer composition embodiments encompass a TAG, such compositions also encompass a cross-linking additive, therefore when the film formed is subjected to a curing bake performed at a temperature sufficient to activate the TAG and generate a strong acid, such acid causes cross-linking to occur thereby reducing the solubility of the film.

The following examples, without being limiting in nature, illustrate methods for making monomers, methods for polymerizing such monomers to form polymers, and making polymer compositions. Such monomers, polymers and compositions being embodiments in accordance with the present invention. In addition, such examples demonstrate the use of such polymer composition embodiments to form self-imageable films. Unless otherwise Indicated in the following examples and elsewhere in the specification and claims, all parts and percentages are by weight, all temperatures are in degrees Celsius, and pressure is at or near atmospheric pressure.

Further, in the experiments presented below where a value for film thickness is provided, such value was determined using a TENCOR profilometer.

In presentation of such experimental data, abbreviations are used to simplify the naming of the various monomers and catalysts. The following listing of those abbreviations provides an appropriate name for each of such abbreviations.
Monomers
NNBMGA N-norbornene methyl gluconamide
NNBMIBA N-norbornene methyl lactobionamide
NBGPENMCDG Norbornene-4-O-(β-D-galactopyranosyl)-β-1'-((+/−)-exo-5-norbornene-2-carboxamide)-1'-deoxy glucitol
Co-Catalysts and Catalysts
LiFABA Li tetrakis(pentafluorophenyl)borate etherate
DANFABA N-dimethylanilinium tetrakis-(pentafluorophenyl)borate
APdCl allyl palladium chloride dimer
PD-1206 (acetonitrile)bis(triisopropylphosphine) palladium (acetate) tetrakis(pentafluorophenyl)borate
PD-1926 nonasodium hydrido (tris(metasulfonatophenyl) phosphine) palladium methanesulfonate
Acids and Salts of Acids
FA formic acid
TPPTSNa trisodium salt of triphenylphosphine m-trisulfonic acid
DAZST-Na 4,4'-diazido stilbene-2,2'-disulfonic acid

MONOMER SYNTHESIS EXAMPLES

Example A1

Synthesis of NNNMGA

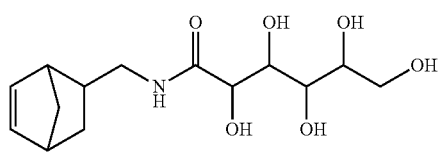 [SMILES: O=C(NCC1CC2C=CC1C2)C(O)C(O)C(O)C(O)CO]

A monomer of NNBMGA according to embodiments of the present invention was prepared essentially in accordance with the procedure described in Puech, et al., *New J. Chem.* 1997, 21, 1229. Norbornene methylamine (69.2 g, 0.56 mol) was added to a methanol solution (approximately 1 Liters (L)) of gluconolactone (100 g, 0.56 mol). The solution was stirred at room temperature for 23 hours (h) resulting in a clear, pale yellow solution. The solution was added to ether (approximately 3.0 L) to yield a precipitate which was filtered, rinsed with ether (approximately 1.0 L) and dried under vacuum at 70° C. overnight, giving 107 g. This amounts to a 63% yield.

Example A2

N-(4-bicyclo[2.2.1]hept-5-en-2yl)methyl-2,3,4,5-tetrahydroxy-pentanamide

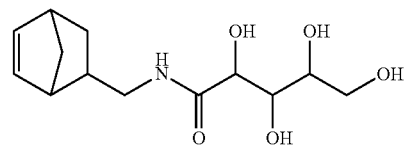 [SMILES: O=C(NCC1CC2C=CC1C2)C(O)C(O)C(O)CO]

A solution of D-ribonolactone (10 g, 67.5 mmol) and norbornenebutylamine (8.32 g 67.5 mmol) in methanol (50 mL) was stirred 23 h at room temperature. The resulting yellow clear solution was concentrated to dryness followed by trituration in methyl-tert-butylether (100 ml) in a 40° C. bath for 1.5 h. The resulting solids were filtered and dried overnight in a vacuum oven at 50° C. to afford 16.8 g (92% yield) of an off-white solid.

The title compound was characterized by LC-MS and $^1$H NMR. LC-MS (m/z) 272 (M+1). $^1$H NMR (500 MHz, DMSO-$d_6$) δ 7.79-7.50 (two triplets, 1H), 6.20-5.90 (three multiplets, 2H), 5.60-5.40 (m, 1H), 4.80-4.70 (d, 1H), 4.60-4.50 (m, 1H), 4.40-4.30 (d, 1H), 4.10-3.95 (m, 1H), 3.63 (br. s, 1H), b3.60-3.50 (m, 2H), 3.20-2.60 (m, 4H), 2.30-2.10 (m, 1H), 1.80-1.70 (m, 1H), 1.55-1.10 (m, 3H), 0.50-0.40 (br. d, 1H). The ratio of endo- to exo-isomer was determined from the olefinic resonances to be 3.9 to 1.

Example A3

N-(4-bicyclo[2.2.1]hept-5-en-2-yl)butyl)-2,3,4,5-tetrahydroxypenamide

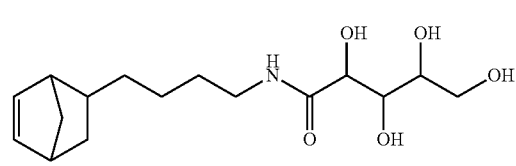 [SMILES: O=C(NCCCCC1CC2C=CC1C2)C(O)C(O)C(O)CO]

A solution of D-ribonolactone (10 g, 67.5 mmol) and norbornenebutylamine (11.2 g, 67.5 mmol) in methanol (50 mL) was stirred 23 h at room temperature. The resulting colorless clear solution was concentrated to dryness followed by trituration in methyl-tert-butylether (100 mL) in a 40° C. bath for 1.5 h. The solids were filtered and dried overnight in a vacuum oven at 50° C. to afford 19.8 g (94% yield) of a white solid.

The title compound was characterized by LC-MS and $^1$H NMR. LC-MS (m/z) 314 (M+1). $^1$H NMR (500 MHz, DMSO-$d_6$) δ 7.55 (br. s, 1H), 6.11 (br. s, 1H), 6.01-5.92 (two broad singlets, 1H), 5.49 (br. s, 1H), 4.75 (br. s, 1H), 4.53 (br.

s, 1H), 4.35 (br. s, 1H), 4.01 (br. s, 1H), 3.62 (br. s, 1H), 3.55 (br. s, 2H), 3.05 (br. s, 1H), 3.04 (br. s, 1H), 2.73 (br. s, 1), 2.71 (br. s, 1H), 1.94 (br. s, 1H), 1.80 (br. s, 1H), 1.60-0.80 (m, 9H), 0.43-0.41 (br. d, 1H). The ratio of endo- to exo-isomer was determined from the olefinic resonances to be 2.7 to 1.

Example A4

N-(4-(bicyclo[2.2.1]hept-5-en-2-yl)butyl)-5-(1,2-dihydroxyethyl)-2,2-dimethyl-1,3-dioxolane-4-carboxamide Step 1: 2,3-isopropylidene(D-Ribonolactone)

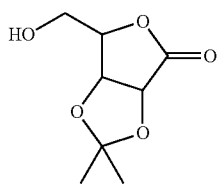

Following the procedure from Williams, et al., *Organic Syntheses*, Vol. 82, p. 75 (2005), to dimethoxypropane (10 mL) taken in a suitable reaction vessel was added a solution of D-ribonolactone (16 g, 96.0 mmol) in dry acetone (70 mL) followed by sulfuric acid (0.1 mL, 2 mmoL). This reaction mixture was allowed to stir for 1 h at room temperature. Silver carbonate (2 g, 7.3 mmol) was added to the reaction and the resulting slurry stirred for 1.5 h followed by filtering through a 3 cm Celite® pad. The filtrate was concentrated to dryness followed by addition of hot ethyl acetate (20 mL) to redissolve the solids and filtering through a 3 cm Celite® pad. The resulting filtrate was allowed to cool to room temperature during which crystals formed. The crystals were filtered to afford 7.9 g of target material. The filtrate was concentrated at elevated temperature to 5 mL and then allowed to cool to room temperature. More crystals formed and were isolated by filtration to give a combined 10.4 g (58% yield) of white crystalline solid.

The title compound was characterized by $^1$H NMR (500 MHz, DMSO-$d_6$) δ 5.30 (t, 1H), 4.76 (s, 2H), 4.60 (t, 1H), 3.68-3.55 (m, 2H), 1.35 (s, 3H), 1.31 (s, 3H).

Step 2: N-(4-(bicyclo[2.2.2]-hept-5-en-2-yl)butyl)-5-(1,2-dihydroxyethyl)-2,2-dimethyl-1,3-dioxolane-4-carboxamide

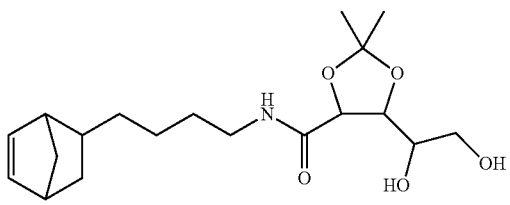 [SMILES: CC1(C)OC(C(=O)NCCCCC2CC3C=CC2C3)C(C(O)CO)O1]

A solution of 2,3-isopropylidene(D-ribonolactone) (5.29 g, 28.1 mmol) and norbornenebutylamine (4.25 g, 28.1 mmol) in methanol (26 mL) was stirred 23 h at room temperature. The resulting colorless clear solution was concentrated affording 9.92 g (100% yield) of a crude colorless oil.

The title compound was characterized by LCMS (m/z) 354 (M+1).

Example A4

Synthesis of NNBMIBA

A monomer of NNBMIBA according to embodiments of the present invention can also be prepared in accordance with the procedure described in Puech, et al., *New J. Chem.* 1997, 21, 1229. NNBMIBA (70 g, 1.51×10$^{-5}$ mol) is added to a methanol solution (approximately 1 Liters (L)) of gluconolactone (100 g, 0.56 mol). The solution is stirred at room temperature for 23 hours (h) resulting in a clear, pale yellow solution. The solution is added to ether (approximately 3 L) to yield a precipitate which is filtered, rinsed with ether (approximately 1 L) and dried under vacuum at 70° C. overnight.

Example A5

Synthesis of NBGPENMCDG

In Hu et al., *Tetrahedron letters* 43, (2002), (1775-1778), a lactamine-functionalized norbornene-type monomer is described. Aqueous $K_2CO_3$ (2M, 35 ml) and 4-O-(β-D-galactopyranosyl)-β-1'-amino-1'-deoxy glucitol [lactamine 1, 12.8 g, 37.3 mmol] are added to a flask. The contents are cooled to –5° C. and $CH_2Cl_2$ (100 ml) solution of (+/–)-exo-5-norbornene-2-carbonyl chloride (7 g) is added slowly so that the internal temperature of the solution never exceeds –2° C. The resulting mixture is stirred at 0° C. for 24 hours and the crude mixture is concentrated and slowly poured into ethanol to precipitate the salts. Following filtration, the filtrate is passed through a mixed bed resin, concentrated, and freeze-dried to obtain the title compound. Polymer Synthesis Examples In each of Tables 1, 2 and 3, below, where presented, the value for formic acid (FA) is in mole percent (mol %), the value for the conversion (Conv.) of monomer to polymer is in percentage (%), the value for $M_w$ of polymer is in g/mol.

Examples B1a-B1e

Polymerization of NNBMGA

For each of Examples B1a through B1e, NNBMGA (3 g), APdCl (0.002 g), LiFABA (0.03 g) TPPTSNa (0.01 g) were added to a glass vial equipped with a stir bar. The vial was sealed with a septum and water (7.5 g sparged with nitrogen) was added to the vial using a syringe. After the components dissolved, the solution was sparged with nitrogen for 30 minutes (min). Then the amount of FA indicated in Table 1, below, was added to a vial and the mixture heated to 80° C. for 19 h. The vials were allowed to cool and a sample was submitted for GPC to determine polymer molecular weight ($M_w$), polydispersity (PDI) and conversion (Conv).

TABLE 1

| Example | FA | Conv. | $M_w$ | PDI |
|---------|-----|-------|--------|------|
| B1a | 0 | 58 | 14,100 | 1.33 |
| B1b | 10 | 89 | 10,100 | 1.33 |
| B1c | 30 | 80 | 8,020 | 1.28 |
| B1d | 50 | 75 | 7,290 | 1.28 |
| B1e | 100 | 48 | 5,100 | 1.14 |

Examples B2a-B2d

Polymerization of NNBMGA

For each of Examples B2a through B2, NNBGMA (3 g), APdCl (0.002 g), LiFABA (0.03 g) and TPPTSNa (0.01 g) were added to a glass vial equipped with a stir bar. The vial was sealed with a septum and water (7.5 g sparged with nitrogen) was added to the vial using a syringe. After the components dissolved in water, the solution was sparged with nitrogen for 30 min. Then the amount of FA indicated in Table 2, below, was added to a vial and the mixture was heated to 45° C. for 120 h. The vial was allowed to cool and a sample was submitted for GPC to determine polymer $M_w$, PDI, and Conv.

TABLE 2

| Example | FA | Conv. | Mw | PDI |
|---|---|---|---|---|
| B2a | 0 | 36 | 20,100 | 1.39 |
| B2b | 5 | 41 | 17,600 | 1.36 |
| B2c | 10 | 42 | 17,000 | 1.41 |
| B2d | 20 | 35 | 14,200 | 1.41 |

Example B3a-B3g

Polymerization of NNBMGA

For each of Examples B3a through B3g, the amount of the palladium complex indicated and NNBMGA monomer were added to a vial equipped with a stir bar. The vial was taken into the dry box and phosphine (if present) and LiFABA were added. On the bench, water and FA were degassed with nitrogen and then added to the monomer and catalyst mixture. The solution was heated to 80° C. for 16 h to 18 h. After cooling the sample was submitted for GPC to determine polymer $M_w$, PDI, and Conv.

Comparative Ex. 1

Polymerization of NNBMGA

The method of Puech, et al., *New J. Chem.*, 1997, 21, 1229-1234, discloses the polymerization of NNBMGA where NNBMGA (0.7 g, 2.31×10$^{-3}$ moles) was dissolved in 10 ml of water after which the catalyst PdCl$_2$(TPPTS)$_2$ was then added in a substrate/catalyst molar ratio of 100/1 (0.0305 g or 2.32×10$^{-5}$ moles). After a 24 hour period, the polymer was precipitated by addition of methanol. Following a successive washing with methanol, the polymer was purified and isolated in 86% yield as a beige powder. The weight average molecular weight ($M_w$) of the resulting polymer was determined to be 5,217.

Comparative Ex. 2

Polymerization of NNBMIBA

In Puech, et al., NNBMIBA (0.7 g, 1.51×10$^{-8}$ moles) was dissolved in 10 ml of water. The catalyst PdCl$_2$(TPPTS)$_2$ was then added in a substrate/catalyst molar ratio of 100/1 (0.0305 g or 2.32×10$^{-5}$ moles). After a 24 hour period, the polymer was precipitated by addition of methanol. Following a successive washing with methanol, the polymer was purified and isolated in 66% yield as a beige powder. The weight average molecular weight ($M_w$) of the resulting polymer was determined to be 5,480.

Comparative Ex. 3

Polymerization of NBGPENMCDG

NBGPENMCDG was polymerized in accordance with the procedures of Hu et al., *Tetrahedron Letters* 43, (2002), 1775-1778). The weight average molecular weight ($M_w$) of the resulting polymer was in the range of 15,800 grams/mol.

Table 3 summarizes the results obtained from. Examples 3a through 3g and the Comparative Examples 1 through 3. It is evident from these results that by practice of the present invention if is now possible to make various water soluble polymers as described herein featuring controlled molecular weight.

TABLE 3

| Ex | Monomer/Catalyst Ratio | Water | Pd | TPPTSNa | LiFABA | FA | Conv. | $M_w$ | PDI |
|---|---|---|---|---|---|---|---|---|---|
| B3a | 500/1 | 14.6 | APdCl | 0.02 | 0.05 | 10 | 95 | 20,400 | 1.56 |
| B3b | 1000/1 | 6.0 | Pd-1926 | | 0.03 | 10 | 85 | 9,400 | 1.30 |
| B3c | 1000/1 | 7.0 | Pd-1206 | | 0.03 | 0 | 64 | 122,800 | 1.60 |
| B3d | 1000/1 | " | Pd-1206 | | 0.03 | 3 | 79 | 87,500 | 1.73 |
| B3e | 1000/1 | " | Pd-1206 | | 0.03 | 5 | 77 | 82,300 | 1.68 |
| B3f | 1000/1 | " | Pd-1206 | | 0.03 | 8 | 78 | 76,200 | 1.66 |
| B3g | 1000/1 | 188 | Pd-1206 | | 0.7 | 10 | 71 | 75,000 | 1.59 |
| Comp. 1 | 100/1 | 10 | PdCl$_2$(TPPTS)$_2$ | | | | 86 | 5,217 | |
| Comp. 2 | 100/1 | 10 | PdCl$_2$(TPPTS)$_2$ | | | | 66 | 5,480 | |
| Comp. 3 | 25.7/1 | | PdCl$_2$ | | | | | 15,800 | 1.07 |

Example B4

Polymerization of NNBMGA

NNBMGA (45 g), APdCl (0.03 mg), LiFABA (0.4 mg) and the TPPTSNa (0.2 mg) were added to a glass vial equipped with a stir bar. The vial was sealed with a septum and water (sparged with nitrogen) was added to the vial using a syringe. After the components dissolved in water, the solution was sparged with nitrogen for 25 min. Then FA (687.4 mL) was added to the vial and the mixture was healed to 60° C. for 18 h. Residual catalyst components were removed from the polymer solution and the polymer was precipitated into 3 L of acetone. The solid was filtered and the filter cake was rinsed with methanol (1 L). The polymer was then dried in a vacuum oven at 70° C. for 16 h. Yield 21.5 g (48%). GPC: Mw=12300; Mn=9180.

Example B5

Precipitation of NNBMGA Polymer from Example B3g

The catalyst residues from polymerization reaction mixture of Example B3g were removed and the polymer was precipitated by adding the solution to 4 L of acetone. The precipitated polymer was filtered and then dried in a vacuum oven at 55° C. overnight. Yield 28 g (34%). GPC: Mw=60,300; Mn=34,000.

Example B6

Synthesis of NNBMGA Polymer

The polymerization procedure from example B1b was repeated at a larger scale and longer time, 50 g of NNBMGA monomer was used. The polymerization was carried out for 20 h. After cooling the reaction mixture, catalyst residues were removed and the polymer was precipitated by adding the solution to 3 L of acetone. The precipitated polymer was filtered and then dried in a vacuum oven at 50° C. overnight. Yield 9 g (18%). GPC: Mw=14,200; Mn=10,800.

Example B7

Precipitation of NNBMGA Polymer from Example B1b

The catalyst residues from polymerization reaction mixture B1b were removed and the polymer was precipitated by adding the solution to 700 ml, of acetone. The precipitated polymer was filtered and then dried in a vacuum oven at 80° C. overnight. Yield 1.1 g (37%). GPC: Mw=9800; Mn=7680.

Film Formation Examples

Example C1

Formation of Thin Films of Poly(NNBMGA)

Film thicknesses as a function of percent, polymer solids in water and spin speed were determined for poly(NNBMGA) from examples B5 and B6. The polymer was dissolved in water at the desired percent polymer solids (see Table 4). The resulting solution was poured onto a thermal oxide silicon wafer. The wafer was initially spun at 500 rpm for 10 sec then for 60 sec at the desired final spin speed (see Table 4). The wafer was then baked at 130° C. for 2 min. The film was scored and the film thickness was determined. In all cases the spun film was of good quality. There were no cracks apparent in the film upon visual inspection.

In Table 4, Table 6 and Table 7, the value for the polymer solid is in percentage by weight of the total composition (% by wt.), the value for Final Spin Speed is in revolutions per minute (rpm), the value for Film Thickness is in micrometers (μm), the values for Post Apply Bake (PAB) and the $2^{nd}$ Bake is in degrees Celsius (° C.) and the value for glutaraldehyde ($C_5H_8O_2$) weight percentage on polymer is in wt. % on polymer.

TABLE 4

| Example | Polymer $M_w$ | Polymer Solid | Final Spin Speed (rpm) | Film Thickness (μm) |
|---|---|---|---|---|
| C1a | 60,000 | 15 | 2,000 | 3.50 |
| C1b | " | " | 1,000 | 5.02 |
| C1c | " | 10 | 2,000 | 0.66 |
| C1d | " | " | 1,000 | 1.08 |
| C1e | " | " | 500 | 2.37 |
| C1f | 14,000 | " | 2,000 | 0.32 |
| C1g | " | " | 1,000 | 0.42 |
| C1h | " | " | 500 | 0.60 |

Optical Density Examples

Example D1

A sample off poly(NNBMGA) (made using Pd-1206 as described in examples B3a through B3g with $M_w$ of 37300 and Mn of 30100) for optical density measurement was prepared by spin coating a 1-inch quartz wafer with an approximately 20 wt. % solution of the polymer in water (500 rpm for 10 sec followed by 2000 rpm for 60 sec). After the wafer was baked for 120 sec at 130° C. on a hotplate and allowed to cool, the optical absorbance of the resulting film was measured at 193, 248 and 365 nm using a Cary 400 UV-Vis spectrophotometer. A blank quartz wafer was used in the reference beam. To determine the polymer film thickness, a portion of the film was removed from the quartz wafer and the thickness measured. The polymer film thickness was 1.11 μm. Optical density was calculated as absorbance/thickness ($\mu m^{-1}$). The results are shown in Table 5.

TABLE 5

| Wavelength ($\mu m^{-1}$) | Optical Density |
|---|---|
| 365 | 0.04 |
| 248 | 0.07 |
| 193 | 0.31 |

Thermal Crosslinking Formulation Examples

Example E1

A sample of poly(NNBMGA) from example B7 was dissolved its water (20 weight percent solution). The solution was spin coated onto a quartz wafer (500 rpm for 5 sec followed by 1500 rpm for 40 sec). The wafer was then baked for 5 min at 130° C. The thickness of the restating film was determined. The wafer was then either not heated, or heated to 130° C., 150° C. or 190° C. for 5 min. Then the film on the wafer was puddle developed in either water or PGMEA for 5 min. The film thickness was then again determined by profilometry. The wafer was baked a $3^{rd}$ time at 190° C. for 3 min and the film thickness was measured again. Results of these experiments are shown in Table 6 below.

The data presented in Table 6 demonstrates that the film encompassing poly(NNBMGA) is soluble in water but not in PGMEA. Furthermore, the film crosslinks after a $2^{nd}$ bake of about 190° C. and therefore does not dissolve.

TABLE 6

| Example | Post Bake | Thickness Post Bake | 2$^{nd}$ Bake | Development Solvent | Thickness After Development | Thickness After 3$^{rd}$ Bake |
|---|---|---|---|---|---|---|
| D1a | 130 | 1.01 | NA | Water | 0.0 | — |
| D1b | " | 0.97 | NA | PGMEA | 0.97 | — |
| D1c | " | 0.93 | 130 | Water | 0.0 | — |
| D1d | " | 1.09 | 150 | Water | 0.0 | — |
| D1c | " | 1.21 | 190 | Water | 1.22 | 1.28 |

Example E2

A sample of poly(NNBMGA) from example B4 was dissolved in a water/PGME 50/50 solution (20 weight percent polymer). As summarized in Table 8, in Examples D2c and D2d glutaraldehyde ($C_5H_8O_2$) was added. The solution was spin coated onto a quartz wafer (500 rpm for 5 sec followed by 1500 rpm for 40 sec). The wafer was then baked for 5 min at 150° C. The thickness of the resulting film was determined. The film on the wafer was puddle developed in water 5 min. The film thickness was again determined. Examples D2c and D2d, the wafer was baked another time at 190° C. for 3 min and the film thickness was measured again. As shown from the data presented in Table 7, it is clear that the glutaldehyde is an effective cross-linking agent preventing significant dissolution of the film after development.

TABLE 7

| Example | $C_5H_8O_2$ | Post Bake | Thickness After Post Bake | Thickness After Development | Thickness After 2$^{nd}$ Bake |
|---|---|---|---|---|---|
| D2a | NA | 150 | 1.09 | 0.0 | NA |
| D2c | 10 | 150 | 1.43 | 1.34 | 1.31 |
| D2d | 20 | 150 | 1.68 | 1.47 | 1.62 |

Photoimageable Formulation and Exposure Examples

Example F1

A sample of poly(NNBMGA) from example B5 was dissolved in water (8 g) and was mixed with 1.2 g of a water solution of DAZST-Na (available from Toyo Gosei, 0.1 g in 3.1 g of water). A film of the above solution was formed by spinning the solution on a thermal oxide silicon wafer (500 rpm for 10 sec followed by 1000 rpm for 60 sec) and baking the film for 2 min at 130° C. The resulting thickness was 0.65 um. The film was image wise exposed at 365 nm (46 mJ/cm$^2$) using an AB-M mask aligner equipped with an i-line band pass filter. The film was baked for 2 min at 130° C. and then developed in water for 10 sec. The film was spun dry and examined using an optical microscope. The photomicrograph shown in FIG. 1 depicts a good resolution for 50 μm via on a 50 μm pitch.

As shown in Comparative Examples 1 and 2, polymerization using PdCl$_2$(TPPTS)$_2$ results in a water soluble saccharide type norbornene polymer having a M$_w$ of 5,217 and a conversion of 86% using a monomer to catalyst ratio of 2.33. Comparative Example 3 shows polymerization using PdCl$_2$ results in a water soluble saccharide type norbornene polymer having a M$_w$ of 15,800.

On the other hand, polymerization Examples B3a-B3g, made according to this invention, demonstrate the M$_w$ controlling effect of a chain transfer activating agent (CTAA) for embodiments of the present invention. That is to say, in combination with palladium catalyst precursors, CTAA's such as formic acid provide for controlling the molecular weight of a resultant polymer. Examples B3d-B3g further demonstrate the ability to achieve high M$_w$ of 75,000 to 87,500 with a conversion of 71% to 79%, a monomer to catalyst ratio of greater than 500 to 1 (therefore a low catalyst loading) and with FA being added in the range of 3% to 10%.

By now it should be realized that the various embodiments in accordance with the present invention disclosed herein advantageously provide at least one of (a) high molecular weights (including a process for making such polymers); (b) controllable molecular weights; and (c) a polymerization process for such polymers that does not require the high catalyst loading of the prior art.

What is claimed is:

1. A method for making a water soluble vinyl addition norbornene-type polymer comprising:
   charging a reaction vessel with a first type of norbornene-type monomer represented by Formula A1:

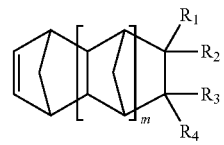

A1 where m is 0 or 1, at least one of $R_1$, $R_2$, $R_3$, and $R_4$ is a saccharide functional moiety selected from monosaccharide, disaccharide, trisaccharide, oligosaccharide or a polysaccharide, and the remaining $R_1$, $R_2$, $R_3$, and $R_4$ are hydrogen;
   further charging the reaction vessel with water, a catalyst, formic acid as a chain transfer activating agent, and an optional co-catalyst where the monomer to catalyst ratio is at least 500/1;
   providing agitation to the reaction vessel contents to promote dissolution of the first type of norbornene-type monomer, catalyst, chain transfer activating agent and optional co-catalyst in the solvent; and
   providing heat and continued agitation to the contents for 18 to 120 hours to facilitate polymerization of the first type of norbornene-type monomer to obtain a polymer having a weight average molecular weight (M$_w$) of at least 18,000.

2. The method of claim 1, further comprising:
   charging the reaction vessel with a second type of norbornene-type monomer represented by Formula A2 distinct from said first type of norbornene-type monomer:

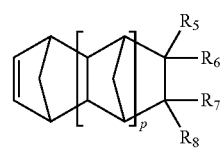

A2 where p is 0 or 1, at least one of $R_5$, $R_6$, $R_7$, and $R_8$ is a hydrocarbyl group, halohydrocarbyl group or a heterohydrocarbyl group and the remaining $R_5$, $R_6$, $R_7$, and $R_8$ are hydrogen.

3. The method of claim 1 where the catalyst is selected from: allyl palladium chloride dimer,
   (acetonitrile)bis(triisopropylphosphine)palladium(acetate) tetrakis(pentafluoro-phenyl)borate, nonasodium hydrido tris (tri(metasulfonatophenyl)phosphine)palladium methanesulfonate,
(acetonitrile)bis(t-butyldicyclohexylphosphine)palladium (acetate) tetrakis(perfluorophenyl)borate,
and mixtures in any combination thereof.

4. The method of claim 1 where the co-catalyst is selected from one or more of the following:
Li tetrakis(pentafluorophenyl)borate etherate (LiFABA), and
N-dimethylanilinium tetrakis-(pentafluorophenyl)borate (DANFABA).

5. The method of claim 1 where the formic acid is present in an amount of from 0.1 to 30 mol % of the total monomer loading to the reaction mixture.

6. The method of claim 1, where the formic acid is present in an amount of from 1 to 10 mol % of the total monomer loading to the reaction mixture.

7. A water soluble vinyl addition norbornene-type polymer comprising a first type of norbornene-type repeating unit represented by Formula B1 which is derived from a monomer of formula A1:

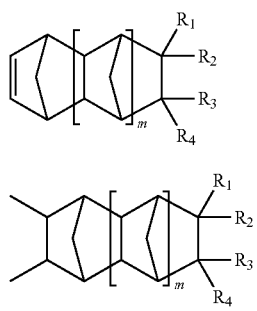

where m is 0 or 1, at least one of $R_1$, $R_2$, $R_3$, and $R_4$ is a saccharide functional moiety selected from monosaccharide, disaccharide, trisaccharide, oligosaccharide or a polysaccharide, and the remaining $R_1$, $R_2$, $R_3$, and $R_4$ are hydrogen; and
said polymer has a weight average molecular weight ($M_w$) of at least 18,000.

8. The polymer of claim 7, further comprising the second type of norbornene-type repeating unit represented by Formula B2 derived from a second norbornene-type monomer represented by Formula A2:

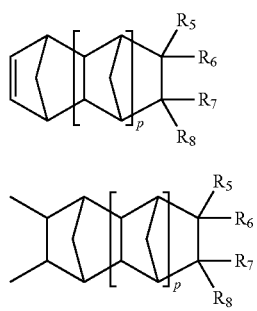

where p is 0 or 1, at least one of $R_5$, $R_6$, $R_7$, and $R_8$ is a hydrocarbyl group, halohydrocarbyl group, or a heterohydrocarbyl group, and the remaining $R_5$, $R_6$, $R_7$, and $R_8$ are hydrogen.

9. The polymer of claim 7, where said saccharide functional moiety is a monosaccharide, a disaccharide, or an oligosaccharide selected from a derivative of an aldose, a ketose, L isomers thereof, D isomers thereof, cyclic isomers thereof, and combinations thereof.

10. The polymer of claim 9, where said aldose is selected from erythrose, threose, ribose, arabinose, xylose, lyxose, allose, altrose, glucose, mannose, gulose, idose, galactose, or talose, and combinations thereof; and where said ketose is selected from erythrulose, xylulose, ribulose, tagatose, sorbose, or fructose, and combinations thereof.

11. The polymer of claim 7, which is poly(N-norbornene methyl gluconamide) having a weight average molecular weight ($M_w$) from 18,000 to 130,000.

12. An aqueous based crosslinkable composition comprising:
a water soluble vinyl addition norbornene-type polymer comprising a first type of norbornene-type repeating unit represented by Formula B1 which is derived from a monomer of formula A1:

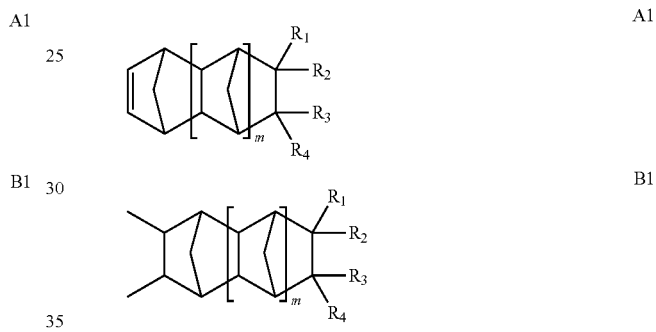

where m is 0 or 1, at least one of $R_1$, $R_2$, $R_3$, and $R_4$ is a saccharide functional moiety selected from monosaccharide, disaccharide, trisaccharide, oligosaccharide or a polysaccharide, and the remaining $R_1$, $R_2$, $R_3$, and $R_4$ are hydrogen; and said polymer has a weight average molecular weight ($M_w$) of at least 18,000;
a casting solvent; and
a crosslinking agent.

13. The composition of claim 12 where the crosslinking agent is glutaraldehyde.

14. The composition of claim 13 which is capable of thermally curing at a temperature below 200° C.

15. A method of forming a crosslinking composition comprising combining
a water soluble vinyl addition norbornene-type polymer of claim 12;
a casting solvent; and
a crosslinking agent.

16. The method of claim 15 where a crosslinking additive is glutaraldehyde.

17. A method of forming a patterned image comprising:
forming a layer of a crosslinking composition of claim 12;
imagewise exposing the layer to appropriate actinic radiation;
causing exposed portions of the layer to undergo crosslinking; and
removing unexposed portions of the layer to form said patterned image.

18. An aqueous based photoimageable composition comprising:
   a water soluble vinyl addition norbornene-type polymer of claim 12;
   a photoactive compound; and
   a solvent.

* * * * *